(12) United States Patent
Kobayashi

(10) Patent No.: US 7,768,196 B2
(45) Date of Patent: Aug. 3, 2010

(54) ORGANIC EL LIGHT-EMITTING DEVICE AND ELECTRONIC APPARATUS

(75) Inventor: Hidekazu Kobayashi, Azumino (JP)

(73) Assignee: Seiko Epson Corporation, Tokyo (JP)

(*) Notice: Subject to any disclaimer, the term of this patent is extended or adjusted under 35 U.S.C. 154(b) by 544 days.

(21) Appl. No.: 11/748,104

(22) Filed: May 14, 2007

(65) Prior Publication Data

US 2007/0273279 A1 Nov. 29, 2007

(30) Foreign Application Priority Data

May 29, 2006 (JP) .............................. 2006-147735

(51) Int. Cl.
*H01J 1/62* (2006.01)
(52) U.S. Cl. ...................... 313/504; 313/509
(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

U.S. PATENT DOCUMENTS

| | | | |
|---|---|---|---|
| 7,126,269 B2 | 10/2006 | Yamada | |
| 7,321,197 B2 | 1/2008 | Nakayama et al. | |
| 2005/0236982 A1* | 10/2005 | Nakayama et al. | ........... 313/506 |
| 2006/0076898 A1* | 4/2006 | Kitazawa | ................... 315/169.3 |
| 2007/0159086 A1* | 7/2007 | Yu et al. | ....................... 313/506 |

FOREIGN PATENT DOCUMENTS

| | | |
|---|---|---|
| JP | A 6-275381 | 9/1994 |
| JP | A-2003-109775 | 4/2003 |
| JP | A 2004-186043 | 7/2004 |
| JP | A-2005-71919 | 3/2005 |
| JP | A-2005-209421 | 8/2005 |
| JP | A-2006-114742 | 4/2006 |
| JP | A-2006-119170 | 5/2006 |

* cited by examiner

*Primary Examiner*—Peter J Macchiarolo
*Assistant Examiner*—Donald L Raleigh
(74) *Attorney, Agent, or Firm*—Oliff & Berridge, PLC

(57) ABSTRACT

A top emission organic EL light-emitting device on a substrate is provided which emits light from the side opposite the substrate. The organic EL light-emitting device includes a light reflection layer, a first electrode made of a transparent conductive material, a function layer including an organic EL luminescent layer that emits light, and a second electrode disposed in that order on the substrate. The second electrode includes a semi-transparent semi-reflective layer that transmits part of the light emitted from the organic EL luminescent layer and reflects the rest of the light. The organic EL light-emitting device also includes a dielectric mirror disposed between the function layer and the light reflection layer. The dielectric mirror acts as an optical resonator that strengthens light having a specific wavelength.

12 Claims, 12 Drawing Sheets

ORGANIC EL LIGHT-EMITTING DEVICE AND ELECTRONIC APPARATUS

BACKGROUND

1. Technical Field

The present invention relates to an organic EL light-emitting device and an electronic apparatus including the light-emitting device.

2. Related Art

EL (electroluminescence) light-emitting devices, particularly organic EL light-emitting devices, feature the ease of reducing the weight and thickness, and are increasingly being used as image forming elements of a display or as light-emitting pixels of an image-forming apparatus that transfers an image formed with a line head module to a medium with a photosensitive drum.

It is desired that monochromaticity is increased in order to increase the color specification range in the field of displays, and in order to prevent the degradation (blur) of formed images resulting from wavelength dispersion of the SEL-FOC® lens array used in imaging optical systems in the field of image-forming apparatuses. For example, Japanese Unexamined Patent Application Publication No. 06-275381 has disclosed a bottom emission light-emitting device to achieve these objects. In this light-emitting device, a dielectric mirror including alternately formed low-refractive-index thin layers and high-refractive-index thin layers is disposed under the luminescent layer so that light having a specific wavelength is strengthened by interference, and thus enhances the monochromaticity.

In addition, in order to increase the lifetime of or reduce the power consumption of organic EL light-emitting devices, it is desired that the aperture ratio, which is the ratio of the area from which light is actually emitted to the area of the display region, is increased, and for example, Japanese Unexamined Patent Application Publication No. 2004-186043 has disclosed a top emission organic EL light-emitting device including a luminescent layer over the pixel driving portion.

However, the dielectric mirror is formed by repeating the deposition of thin layers, so that the underlying layer is damaged by, for example, heating. It is therefore difficult to provide a dielectric mirror over the luminescent layer, which is made of an organic material. Thus it is difficult to provide a dielectric mirror in a top emission type, which emits light from the upper side of the luminescent layer.

SUMMARY

According to an aspect of the invention, there is provided a top emission organic EL light-emitting device formed on a substrate, emitting light from the side opposite the substrate. The organic EL light-emitting device includes a light reflection layer, a first electrode made of a transparent conductive material, a function layer including an organic EL luminescent layer that emits light, and a second electrode disposed in that order on the substrate. The second electrode includes a semi-transparent semi-reflective layer that transmits part of the light emitted from the organic EL luminescent layer and reflects the rest of the light. The organic EL light-emitting device also includes a dielectric mirror disposed between the function layer and the light reflection layer. The dielectric mirror acts as an optical resonator that strengthens light having a specific wavelength.

In this structure, light having a specific wavelength of the light reflected from the semi-transparent semi-reflective layer is strengthened in the dielectric mirror formed under the function layer and is then emitted to the outside. This structure allows the dielectric mirror to be provided in a top emission EL device. Consequently, the organic EL light-emitting device has long lifetime or low power consumption, and besides exhibits high monochromaticity.

Preferably, the dielectric mirror is formed by alternately forming at least one low-refractive-index material layer and at least one high-refractive-index material layer on the light reflection layer.

Such a dielectric mirror causes the light emitted from the function layer to resonate several times before the light reaches the light reflection layer. Consequently, the intensity of light having a specific wavelength is further increased.

Preferably, the first electrode is made of ITO (indium tin oxide) and doubles as one of the at least one high-refractive-index material layer.

By using the first electrode as at least part of the high-refractive-index material layer, the dielectric mirror may be formed by forming a single low-refractive-index material layer under the first electrode. Thus, light having a specific wavelength can be strengthened while the manufacturing cost is reduced.

Preferably, the high-refractive-index material layer is made of silicon nitride and the low-refractive-index material layer is made of silicon oxide.

Silicon nitride and silicon oxide are superior in strength and in controlling the thicknesses. Such a dielectric mirror prevents reduction in reliability and increase in manufacturing cost, and increases the intensity of light having a specific wavelength.

Preferably, the low-refractive-index material layer and the high-refractive-index material layer each have an optical path length equal to about a quarter of the specific wave length in the thickness direction. More preferably, the sum of the optical path lengths of the low-refractive-index material layer and the high-refractive-index material layer in the thickness direction is about half of the specific wavelength.

Thus, the sum of the optical path lengths of the high-refractive-index material layer and the low-refractive-index material layer agrees with the wavelength of the light whose intensity is to be enhanced. Accordingly, the thicknesses of these material layers can be easily set.

Preferably, the second electrode further includes a layer formed of a transparent conductive material on the semi-transparent semi-reflective layer.

Such a second electrode has a lower sheet resistance while suppressing the effect on the optical transparency. Accordingly, the transparency and reflectivity of the semi-transparent semi-reflective layer can be set in a wider range.

Preferably, the first electrode and the semi-transparent semi-reflective layer are set so as to have an optical path length therebetween that can strengthen the light having the specific wavelength.

By adding the function of strengthening the light having a specific wavelength to the function layers the intensity of the light is further enhanced.

Preferably, the function layer further includes a hole injection layer on which the organic EL luminescent layer is disposed, and the sum of twice of the optical path length of the hole injection layer in the thickness direction and the optical path length of the organic EL luminescent layer in the thickness direction is about half of the specific wavelength.

Thus, the optical path length of the path through which light reflected from the surface of the first electrode reaches the surface of the second electrode agrees with the wavelength of the light whose intensity is to be enhanced. Accordingly, the thicknesses of the material layers can be easily set.

According to another aspect of the invention, an electronic apparatus is provided which includes a line head module including a line head including the organic EL light-emitting devices in proper alignment.

The line head may be used in an image-forming apparatus. Since the photosensitive member is exposed to light with increased monochromaticity from the line head, more precise images can be formed on a medium, and the power consumption can be reduced.

According to another aspect of the invention, an electronic apparatus is provided which includes a type of the organic EL light-emitting device whose dielectric mirror acts as an optical resonator strengthening red light having a specific wavelength, a type of the organic EL light-emitting device whose dielectric mirror acts as an optical resonator strengthening green light having a specific wavelength, and a type of the organic EL light-emitting device whose dielectric mirror acts as an optical resonator strengthening blue light having a specific wavelength. The organic EL, light-emitting devices of red, green, and blue lights are arranged in a matrix manner in a region from which light is emitted.

Since the organic EL light-emitting devices for three primary color lights each emit light with enhanced monochromaticity, a display device displaying high-quality mages in a wider color specification range can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention will be further described using embodiments with reference to the drawings. For ease of description and understanding, the essential structure of an organic EL light-emitting device will be described before the description of the embodiments.

Figure 1A:
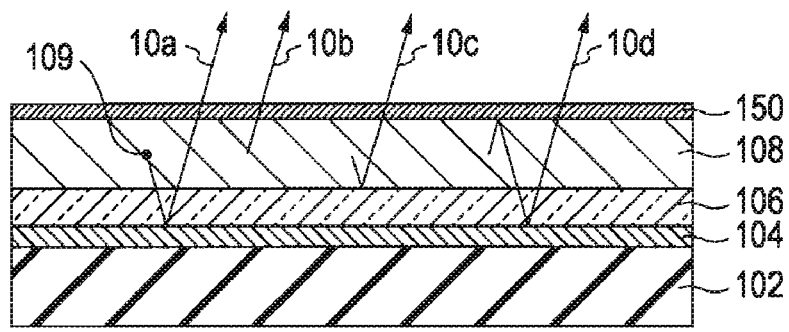
FIGS. 1A to 1C are schematic representations of the behaviors, such as reflection, of light produced by the luminescent layer of a light-emitting device.
Figure 1B:
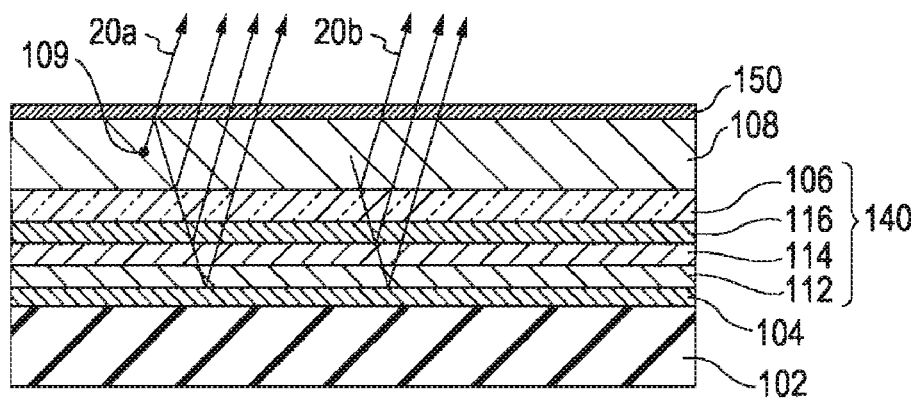
Figure 1C:
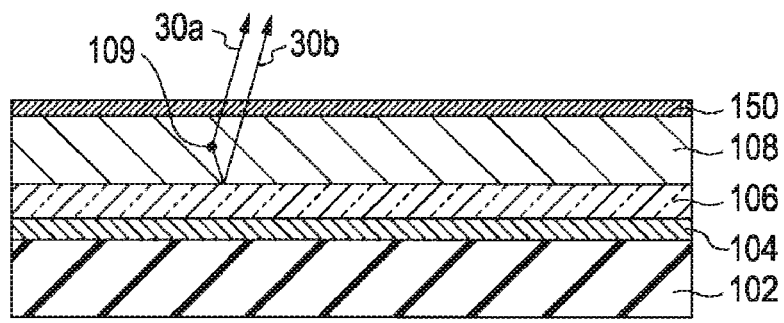

FIGS. 1A to 1C are schematic representations of portions around the luminescent layers of a known top emission organic EL light-emitting device and a top emission light-emitting device (hereinafter referred to as "light-emitting device") according to an embodiment of the invention, and show behaviors, such as reflection, of light produced by the respective luminescent layers: FIG. 1A is a sectional view of the known light-emitting device including a luminescent layer lass and other layers; FIG. 1B is a sectional view of a light-emitting device according to an embodiment of the invention including a luminescent layer 108 and a light reflection layer 104 with a dielectric mirror 140 therebetween, showing interference with emitted light from the dielectric mirror 140; FIG. 1C is a representation of interference with emitted light between a first electrode 106 and a second electrode 150.

As shown in FIG. 1A, the pixel of a light-emitting device is constituted of a light reflection layer 104, a first electrode (anode) 106, a luminescent layer 108, and a second electrode (cathode) 150 that are formed on an insulator layer 102 on a substrate. When a current is applied between the first electrode (anode) 106 and the second electrode (cathode) 150, the current flows in the luminescent layer 108 to cause an EL phenomenon. The light reflection layer 104 is made of a light shielding metal, such as aluminum, and reflects the downward light (toward the substrate) produced by the luminescent layer 108 so that the light is emitted upward. Thus, the light-emitting device is a top emission type.

The first electrode 106 is made of ITO, which has a nigh work function. The second electrode 150 is a thin film made of a metal or an alloy having a low work function, such as Ba or MgAg. By forming the second electrode 150 to a small thickness, the second electrode 150 can exhibit optical transparency as high as possible and reduced reflectivity while ensuring high electroconductivity. In other words, the known light-emitting device is a top emission type designed so that light traveling upward (toward the side opposite the substrate) of the light produced by the luminescent layer 108 is directly emitted as much as possible.

Reference numerals 10a to 10d designate schematically shown light rays with the assumption that light emission occurs at the midpoint 109 of the luminescent layer 108 in the thickness direction (direction perpendicular to the surface of the substrate). For ease of understanding the manner of reflection, light travels in a slanting direction and the variation in incident angle due to refraction is omitted (the same applies to FIGS. 1B and 1C). As shown in FIG. 1A, light produced by the luminescent layer 108 is broadly divided into upward light and downward light.

The downward light 10a is transmitted across the optically transparent first electrode 106 and reflected at the surface of the light reflection layer 104. The reflected light goes upward and is transmitted across the luminescent layer 108 and the second electrode 150, thus exiting to the outside of the device. Part of the downward light is reflected upward at the surface of the first electrode 106, as shown by the line designated by 10c, thus exiting to the outside of the device as with light 10a.

The upward light 10b is directly transmitted across the luminescent layer 108 and the second electrode 150 and emitted upward. Part of the upward light is reflected downward at the second electrode 150 as shown by the line designated by 10d, and then further reflected upward at the surface of the light reflection layer 104 as with light 10a thus exiting upward across the luminescent layer 108 and the second electrode 150.

Since almost all the downward light is reflected at the light reflection layers interference hardly occurs between the downward light and the light reflected from the first electrode 106. Also, since no dielectric mirror is provided on the luminescent layer 108, interference with the upward light hardly occurs. The wavelength distribution of light emitted to the outside of the device does not substantially change from that of light immediately after being produced by the luminescent layer 108.

In a light-emitting device according to an embodiment of the invention, a dielectric mirror 140 is provided between the first electrode 106 and the light reflection layer 104, so that the wavelength distribution can be appropriately set by interference without providing another dielectric mirror over the luminescent layer 108 in spite of a top emission type. Also, the light transmittance of the second electrode 150 is set at about 50% so that about half of the light emitted upward is reflected downward and transmitted across the dielectric mirror 140 to resonate. Thus the wavelength distribution is further appropriately set. In addition, the thicknesses of function layers including the luminescent layers 108 are optimized so as to cause interference between the first electrode 106 and the second electrode 150. Thus, the wavelength distribution is still further appropriately set.

FIG. 1B shows a light-emitting device according to an embodiment of the invention, including a dielectric mirror 140 between the first electrode 106 and the light reflection layer 104 and the state of interference with light produced by the luminescent layer 108 from the dielectric mirror. As shown in this figure, a first low-refractive-index material layer 112, a first high-refractive-index material layer 114, and a second low-refractive-index material layer 116 are formed in that order on the light reflection layer 104, and constitute the dielectric mirror 140 with the first electrode 106. The first electrode 106 serves as an electrode and doubles as a second high-refractive-index material layer. The second electrode 150 includes a semi-transparent semi-reflective layer that transmits part of light emitted from the luminescent layer 108 and reflects the rest of the light.

Reference numerals 20a to 20b designate schematically shown light rays with the assumption that light emission occurs at the midpoint 109 of the luminescent layer 108, as with the above known type. As shown by the line designated by 20a, about half of the light produced by the luminescent layer 108 goes upward. Part of the upward light is reflected downward at the semi-transparent semi-reflective second electrode 150 and enters the dielectric mirror 140. When light comes into a composite of dielectric layers having different refractive indices, part of the light is reflected at interfaces of the dielectric layers. In particular, light transmitted across a low-refractive-index material layer is reflected by a large amount when the light enters a high-refractive-index material layer. Thus, downward light is broadly divided into light reflected from the first electrode 106, light reflected from the interface between the first high-refractive-index material layer 114 and the second low-refractive-index material layer 116, and light reflected from the light reflection layer 104, and the light rays through these three paths go in the same direction to be emitted to the outside of the device. In this instance, the thickness of each layer of the dielectric mirror 140 is optimized, so that a specific wavelength of light is strengthened to increase the monochromaticity by interference.

Light emitted downward from the midpoint 109 goes in the same manner. Specifically, the downward light is divided into three and turns upward through different paths to exit from the device, as shown in the arrows designated by 20b. Since the downward light passes through the same dielectric mirror 140 as the light reflected from the second electrode 150, light having the same wavelength as the light shown by the arrows 20a is strengthened. About half of the light shown by the arrows 20a is transmitted across the dielectric mirror 140. All the light shown by the arrows 20b is transmitted across the dielectric mirror 140. As a result, about 75% of the light produced by the luminescent layer 108 is emitted with light having a specific wavelength strengthened. The dielectric mirror 140 is not limited to the above structure. As described below, the effect described above can be produced as long as the dielectric mirror has at least one pair of low-refractive-index material layer and high-refractive-index material layer.

FIG. 1C is a representation of the state of the interference between the first electrode 106 and the second electrode 150 of a light-emitting device. This structure does not have a dielectric mirror between the first electrode 106 and the light reflection layer 104, as in the structure shown in FIG. 1A. Even if no dielectric mirror is provided, interference can be occur between the upward light 30a and the light 30b emitted downward, reflected at the first electrode, and turns upward, of the light produced at the midpoint 109 of the function layer, as shown in FIG. 1C. By optimizing the thickness of the function layer so that light having a specific wavelength can be strengthened, the effect of the dielectric mirror 140 shove in FIG. 1B is complemented.

Tables 1 to 4 show the effect in optimizing the thicknesses of the dielectric mirror and the function layer shown in FIGS. 1B and 1C. These are the evaluation results of monochromaticities of light-emitting devices including a luminescent layer emitting red light having a wavelength of about 640 nm. In the evaluation, the thicknesses of the low-refractive-index material layers and high-refractive-index material layers constituting the dielectric mirror are varied with the function layer having a constant thickness.

TABLE 1

|  | Known structure | 1 Pair | | | | | | | | |
|---|---|---|---|---|---|---|---|---|---|---|
| ITO nm | 130 | 10 | 20 | 30 | 40 | 50 | 60 | 70 | 80 | 90 |
| SiO$_2$ nm |  | 170 | 150 | 140 | 120 | 110 | 90 | 80 | 60 | 50 |
| dominant wavelength nm | 641.6 | 649 | 640 | 643.2 | 637.7 | 643 | 639.3 | 644.8 | 640.5 | 644.8 |
| Half-width nm | 60 | 63.9 | 60.9 | 63.2 | 61 | 63.3 | 60.8 | 62.8 | 60.1 | 61.4 |
| Intensity | 0.02000 | 0.02254 | 0.02281 | 0.02352 | 0.02330 | 0.02380 | 0.02315 | 0.02326 | 0.02221 | 0.02205 |

TABLE 2

| | 2 Pairs | | | | | | | | | |
|---|---|---|---|---|---|---|---|---|---|---|
| SiN nm | 10 | 20 | 30 | 40 | 50 | 60 | 70 | 80 | 90 | 100 |
| SiO$_2$ nm | 80 | 60 | 50 | 150 | 140 | 120 | 100 | 90 | 70 | 60 |
| dominant wavelength nm | 657 | 640.6 | 649 | 645.1 | 651.1 | 645 | 639.5 | 646.7 | 639.7 | 645.3 |
| Half-width nm | 66.3 | 60.8 | 64.7 | 50.1 | 53.2 | 51.2 | 48.6 | 50.7 | 46.5 | 47.5 |
| Intensity | 0.02210 | 0.02230 | 0.02268 | 0.02000 | 0.02074 | 0.02070 | 0.02000 | 0.02000 | 0.01831 | 0.01820 |

TABLE 3

| | 3 Pairs | | | | | | | | | |
|---|---|---|---|---|---|---|---|---|---|---|
| SiN nm | 10 | 20 | 30 | 40 | 40 | 50 | 50 | 60 | 70 | 80 |
| SiO$_2$ nm | 120 | 110 | 90 | 80 | 150 | 70 | 150 | 130 | 120 | 100 |
| dominant wavelength nm | 648.7 | 657.1 | 639.3 | 648 | 633 | 656.6 | 656.6 | 649 | 657.2 | 650 |
| Half-width nm | 44.8 | 47.1 | 43.9 | 46.7 | 40.3 | 48.8 | 46.7 | 46 | 48.5 | 45.4 |
| Intensity | 0.01660 | 0.01670 | 0.01687 | 0.01740 | 0.01692 | 0.01731 | 0.0867 | 0.01923 | 0.01931 | 0.01861 |

TABLE 4

| | Known structure | 1 Pair | | 2 Pairs | | | 3 Pairs | | | |
|---|---|---|---|---|---|---|---|---|---|---|
| SiN nm | 130 | 100 | 90 | 30 | 40 | 50 | 40 | 50 | 30 | 20 |
| SiO$_2$ nm | | 120 | 150 | 150 | 130 | 110 | 150 | 130 | 80 | 100 |
| dominant wavelength nm | 641.6 | 647 | 648.5 | 649.4 | 647.3 | 647.2 | 656.8 | 651.3 | 640.9 | 648.8 |
| Half-width nm | 60 | 47 | 48.3 | 49 | 50.2 | 50.7 | 42.1 | 42.8 | 44.9 | 45.8 |
| Intensity | 0.02000 | 0.01600 | 0.01610 | 0.01790 | 0.01830 | 0.01830 | 0.01520 | 0.01580 | 0.01674 | 0.01676 |

Table 1 shows the monochromaticities of organic EL light-emitting devices including a one-pair type dielectric mirror and a known type of organic EL light-emitting device. Specifically, the one-pair type dielectric mirror is composed of a pair of low-refractive-index material layer and high-refractive-index material layer formed on the light reflection layer. The low-refractive-index material layer was made of silicon oxide, and this also applies to all the following evaluations. The monochromaticity is represented by half-width and intensity. The intensity shown in the tables is a dimensionless number representing the maximum intensity of emitted light indicated by an analyzer. The half-width represents a width of the range of wavelengths in which the intensity is at least half of the maximum intensity. The evaluations of the monochromaticites shown in Tables 2 to 4 are based on the half-width and the intensity as well.

The high-refractive-index material layer in the evaluation shown in Table 1 is made of ITO and doubles as the first electrode. Specifically, the light-emitting devices of Table 1 have the structure in which a silicon oxide single layer is formed between the light reflection layer and the ITO first electrode of the known top emission light-emitting device. Table 1 shows that the intensity can be enhanced when the half-width is set to the same level as that of the known light-emitting device, which does not include a dielectric mirror. In particular, when the ITO layer has a thickness of 80 nm and the silicon oxide layer has a thickness of 60 nm, the intensity is 11% increased with the half-width kept at about 60 nm.

Table 2 shows the monochromaticities of light-emitting devices including a two-pair type dielectric mirror on the light reflection layer. One of the high-refractive-index material layers closer to the light reflection layer is made of silicon nitride, and the other is made of ITO and doubles as the first electrode. As shown in Table 2, this structure can increase at least either the intensity or the half-width more than the known light-emitting device. In particular, when the high-refractive-index material layers each have a thickness of 70 nm and the silicon oxide layers or low-reflective-index material layers each have 100 nm, the half-width is reduced by a large amount to 48.6 nm with the intensity kept the same as that of the known light-emitting device.

Table 3 shows the monochromaticities of light-emitting devices including a three-pair type dielectric mirror on the light reflection layer. One of the high-refractive-Index material layers closest to the light reflection layer and another one disposed in the middle are made of silicon nitride, and the other, that is, the uppermost layer of the high-refractive-index material layers, is made of made of ITO and doubles as the first electrode. Although the intensity is slightly reduced more than that of the known light-emitting device, the half-width is reduced by a large amount in particular, when the high-refractive-index material layers each have a thickness of 40 nm and the silicon oxide layers each have a thickness of 150 nm, the half-width is reduce by a large amount to 40.3 nm.

Table 4 shows the monochromaticities of light-emitting devices including a dielectric mirror formed by depositing a nigh-refractive-index material layer, a low-refractive-index material layer, and another high-refractive-index material layer in that order on the light reflection layer. Hence, unlike the dielectric mirrors of Tables 1 to 3, a silicon oxide layer acting as a low-refractive-index material layer is not formed on the light reflection layer. The uppermost layer of the high-refractive-index material layers is made of ITO as in the other cases. Table 4 shows that this structure advantageously reduces the half-width, but cannot suppress the decrease in intensity effectively. Thus, the dielectric mirrors of Table 4 are inferior in practical use to the dielectric mirror having a silicon oxide layer as a low-refractive-index material layer on the light reflection layer.

Preferably, the total of the optical path lengths (product of the thickness and the refractive index) of a pair of low-refractive-index material layer and high-refractive-index material layer is half of the wavelength of light to be strengthened. More specifically, the optical path lengths of the low-refractive-index material layer and the high-refractive-index material layer are each set at a quarter of the wavelength of light to be strengthened. In a theoretical sense, light emitted upward and light reflected upward from the dielectric mirror cause interference, and consequently, the light having a wavelength equal to the optical path length is strengthened. As shown in Tables 1 to 4, however, such a theory does not always apply to light-emitting devices in practical use because of, for example, the effect of the function layer thickness. It is therefore preferable that if the invention is applied to a light-emitting device in practice, an appropriate thickness of each layer is determined according to simulations or experiments.

Figure 2A:
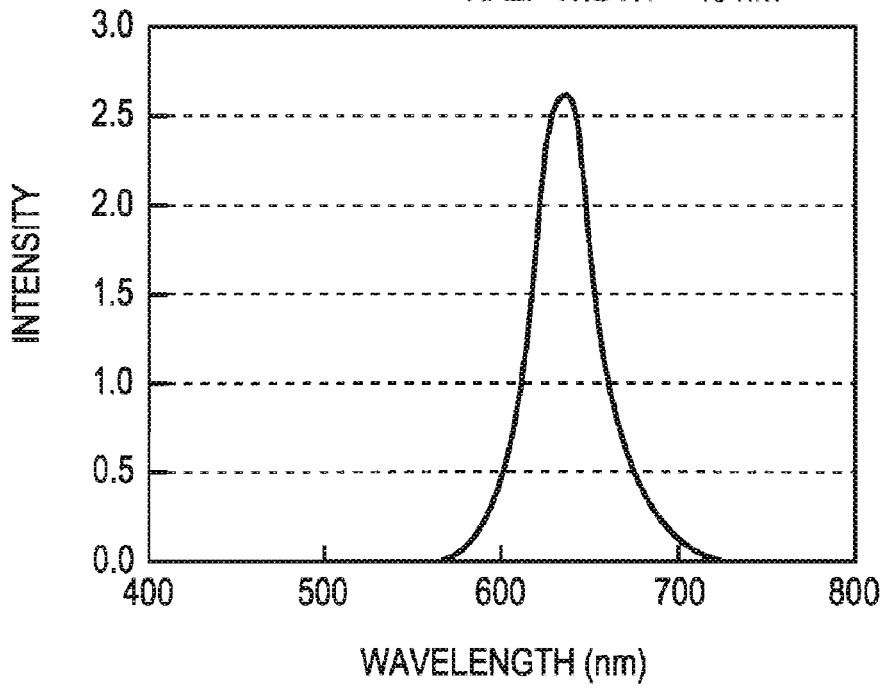
FIGS. 2A to 2D are graphs showing an effect of a dielectric mirror.
Figure 2B:
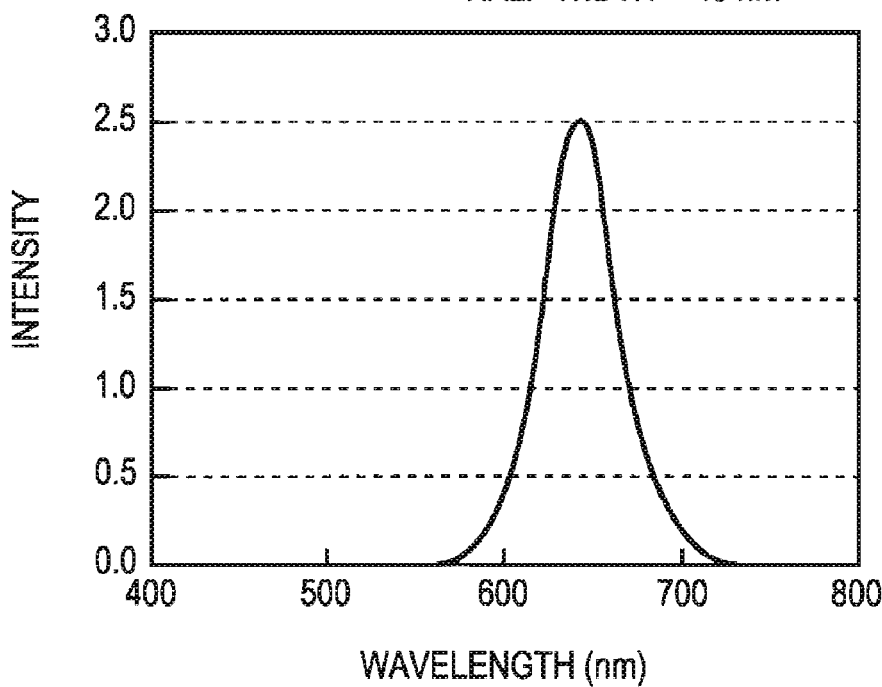
Figure 2C:
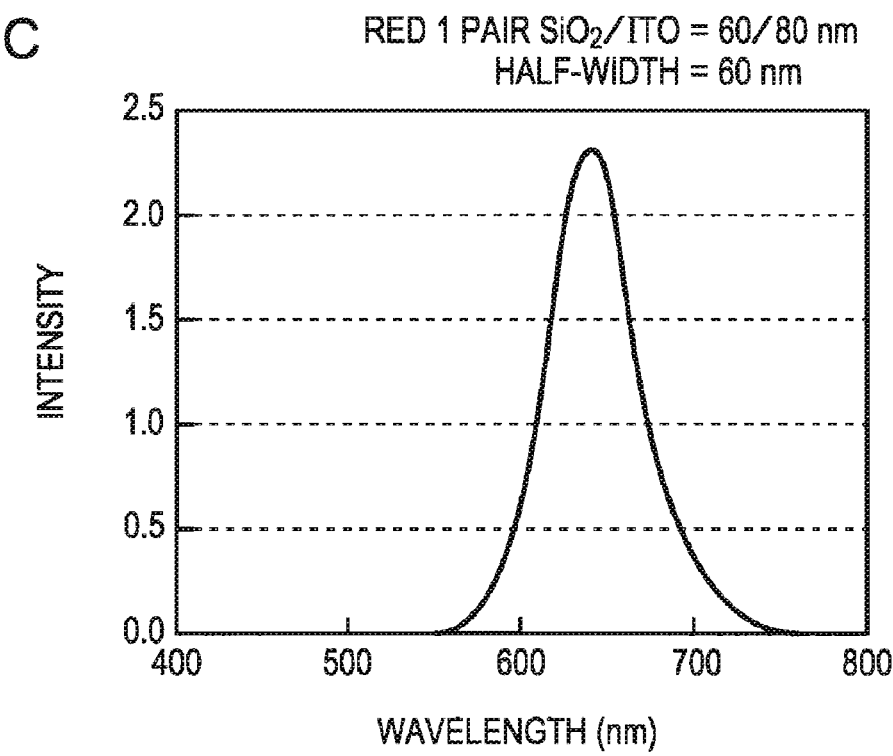
Figure 2D:
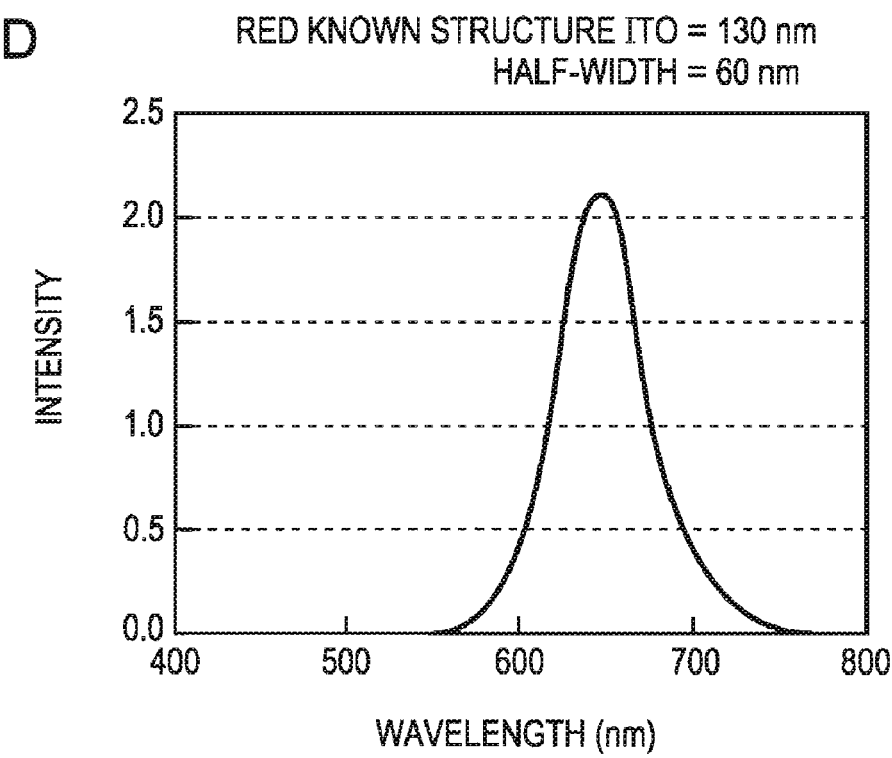

FIGS. 2A to 2D show favorable results in the evaluations of the dielectric mirror effect shown in Tables 1 to 3: FIG. 2A shows the effect of a three-pair type dielectric mirror; FIG. 2B, the effect of a two-pair type dielectric mirror; FIG. 2C, the effect of a one-pair type dielectric mirror; and FIG. 2D, the characteristics of the known light-emitting device having no dielectric mirror. Each dielectric mirror of the figures increases the monochromaticity, as shown in the above tables, and particularly increases the half-width effectively. Electronic apparatuses using these light-emitting devices will now be described according to embodiments.

First Embodiment

FIGS. 3A to 6 show a light-emitting device according to a first embodiment of the invention line head including the light-emitting devices, and an image-forming apparatus (printer) being an electronic apparatus including the line heads.

Figure 3A:
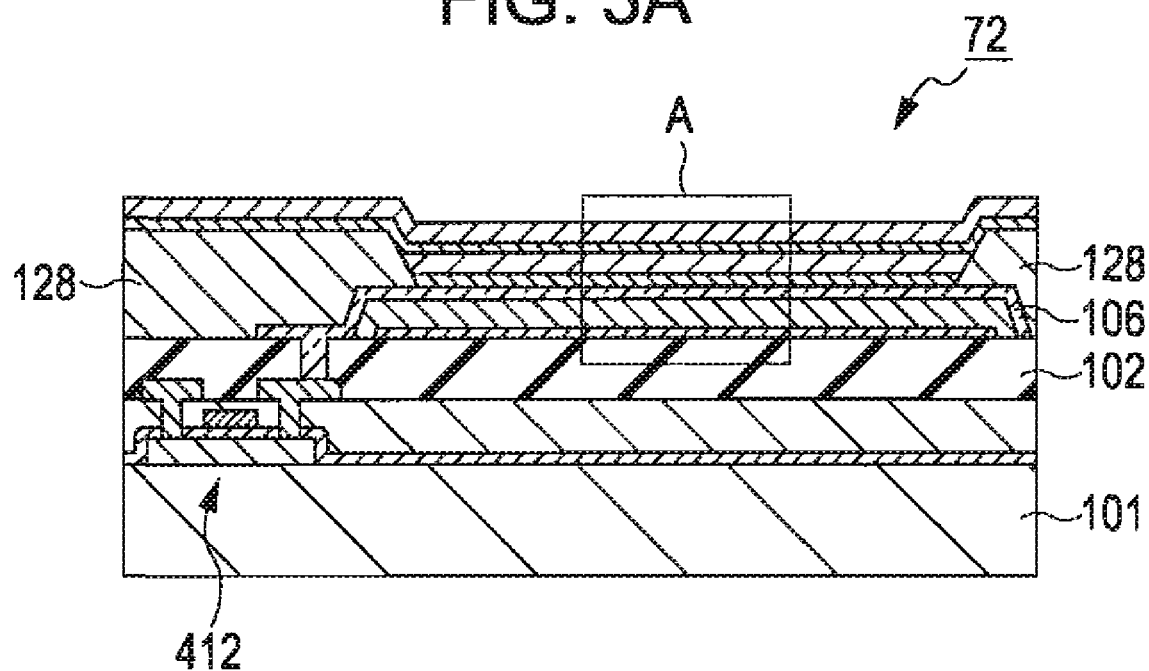
FIGS. 3A and 3B are sectional views of a light-emitting device with a driving thin-film transistor (TFT).
Figure 3B:
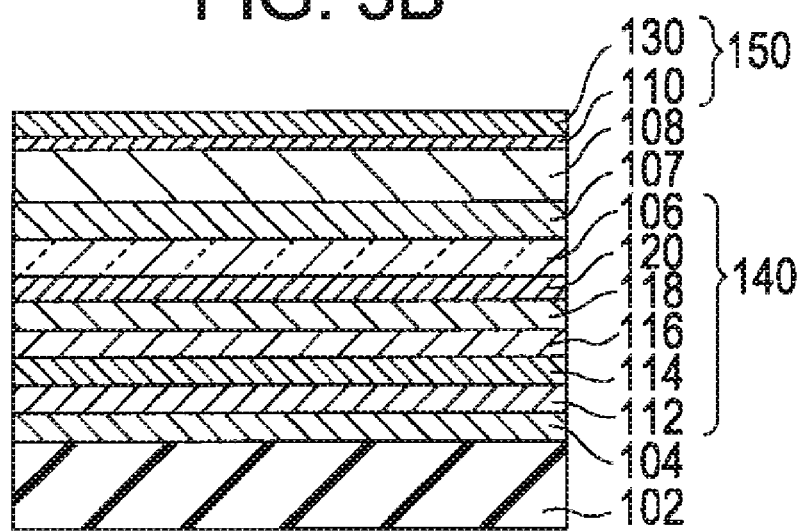

FIG. 3A is a sectional view of the light-emitting device 72 according to the present embodiment with a driving thin film transistor (hereinafter referred to as TFT) 412. FIG. 3B is an enlarged view of portion A shown in FIG. 3A. The light-emitting device 72 is of too emission type. The substrate 101 is therefore not necessarily optically transparent, and can be made of glass, ceramic, a metal, or any other material. The light-emitting device 72 is formed on an insulating layer 102 that is formed on the substrate 101 with a plurality of layers in between. The insulating layer 102 is intended to separate the TFT 412 from the light reflection layer and the pixel electrode, and is formed by CVD of silicon oxide. The TFT 412 is prepared by a known technique and is electrically connected to a first electrode 106 of the light-emitting device 72. The TFT 412 drives the light-emitting device 72 according to instructions from a control circuit.

Function layers including a hole injection layer 107 with a thickness of 50 nm and a luminescent layer 108 with a thickness of 120 nm are formed on the surface of the first electrode 106 in a recess surrounded by a partition member 128.

In use as an image-forming apparatus as in the present embodiment, the luminescent layer 108 is preferably made of a material that can emit red light having a wavelength of about 640 nm. Since the invention features the dielectric mirror 140, the luminescent layer 108 may be made of a known material. Exemplary luminescent layer materials include (poly)fluorene derivatives (PF), (poly)para-phenylene vinylene derivatives (PPV), polyphenylene derivatives (PP) poly(para-phenylene) derivatives (PPP), polyvinylcarbazole (PVK), polythiophene derivatives, and polysilanes such as poly(methylphenylsilane) (PMPS). In addition, in order for the luminescent layer 108 to emit red light, rhodamine, a DCM derivative, nile red, or the like is added to the material of the luminescent layer 108.

The hole injection layer 107 supplies holes to the luminescent layer. The holes injected from the hole injection layer 107 are coupled with electrons from the second electrode in the luminescent layer, so that EL phenomenon occurs. The above-mentioned thicknesses are set so as to strengthen a specific wavelength, as described below. The hole injection layer 107 can be made from a material prepared by dispersing polystyrene, polypyrrole, polyaniline, polyacetylene, or any of their derivatives in a disperse medium such as polystyrene sulfonate. A Ca layer 110 is formed as the semi-transparent semi-reflective layer on the function layers, and an ITO layer 130 is formed on the Ca layer 110. The Ca layer 110 and the ITO layer 130 define a second electrode 150.

The Ca layer 110 is formed to a thickness as small as 18 nm so as to be semi-transparent and semi-reflective to visible light. More specifically, the Ca layer 110 transmits about 50% of the light emitted upward from the luminescent layer 108 so that the light is emitted from the side opposite the substrate 101. The rest, about 50%, of the light is reflected downward (toward the substrate 101) from the Ca layer 110. The ITO layer 130 with a thickness of 100 nm transmits almost all the emitted light. Thus, the sheet resistance of the second electrode 150 can be reduced without degrading the optical transparency above the luminescent layer 108.

The dielectric mirror 140 is formed between the light reflection layer 104 and the hole injection layer 107. The dielectric mirror 140 has the structure shown in Table 3 and FIG. 2A. Specifically, the dielectric mirror 140 is of three-pair type, and includes silicon oxide low-refractive-index material layers, silicon nitride high-refractive-index material layers, and an ITO high-refractive-index material layer doubling as the first electrode. More specifically, the dielectric mirror 140 includes 6 layers on the light reflection layer 104 in this order: a 140 nm thick silicon oxide layer 112 acting as a first low-refractive-index material layer; a 50 nm thick silicon nitride layer 114 acting as a first high-refractive-index material layer; a 140 nm thick silicon oxide layer 116 acting as a second low-refractive-index material layer; a 50 nm thick silicon nitride layer 118 acting as a second high-refractive-index material layer; a 140 nm thick silicon oxide layer 120 acting as a third low-refractive-index material layer; and a 50 nm thick ITO layer acting as the first electrode 106. The high-refractive-index material layers may be made of any other transparent material having a refractive index of 1.6 or more, such as zirconium.

Figure 4:
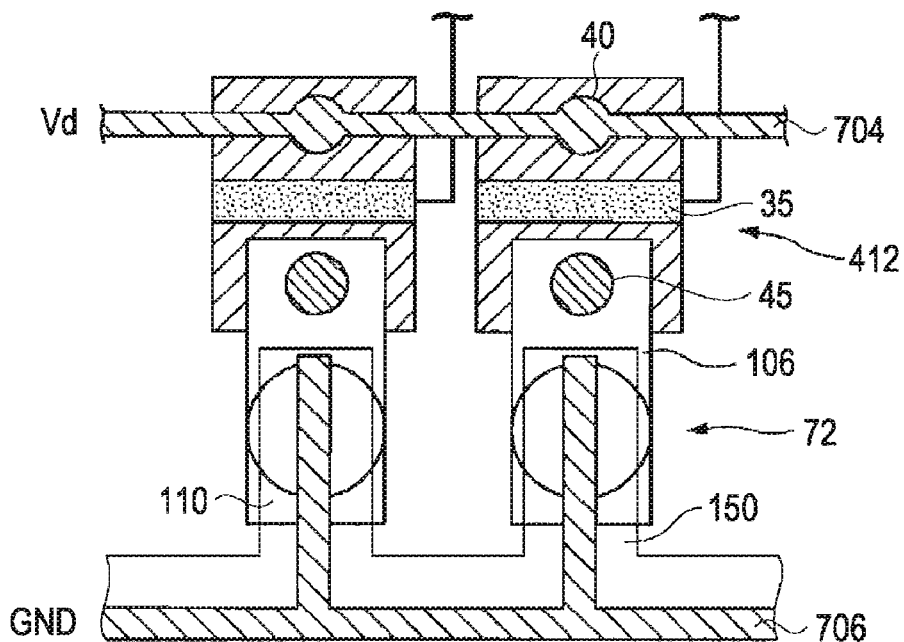
FIG. 4 is a representation of TFTs and light-emitting devices viewed in the direction perpendicular to the substrate.
Figure 5A:
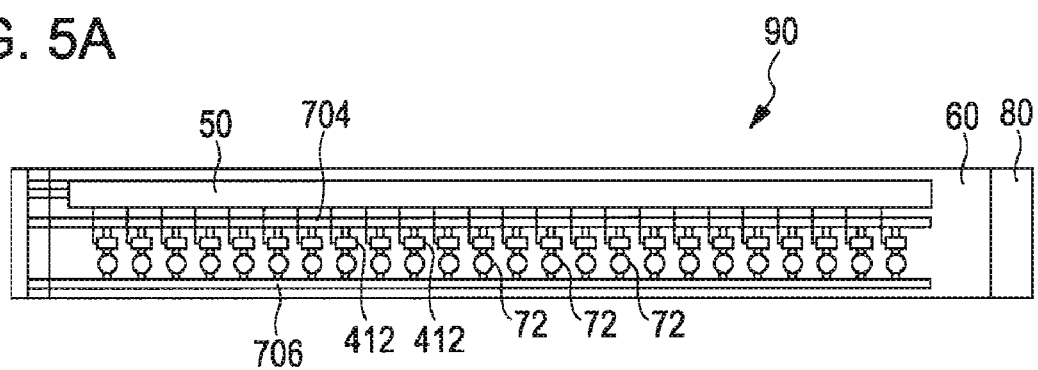
FIGS. 5A and 5B are representations of a line head including light-emitting devices and TFTs in proper alignment.
Figure 5B:
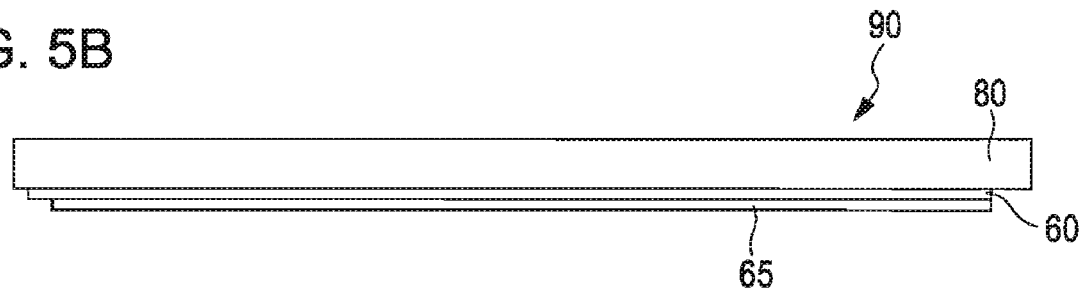

As described above, about 50% of the light emitted upward from the luminescent layer 108 is reflected from the Ca layer 110 toward the substrate 101, and about 50% of the entire light produced by the luminescent layer 108 travels toward the substrate 101. Hence, about 75% of the entire light produced by the luminescent layer 108 enters the dielectric mirror 140, and light having a specific wavelength is strengthened by the interference described with reference to FIG. 1B. The light having a specific wavelength is further strengthened in the function layers by the interference described with reference to FIG. 1C. Consequently, the resulting light-emitting device can exhibit enhanced monochromaticity. FIGS. 4 and 5A and 5B show a line head of an image-forming apparatus including such light-emitting devices 72. FIG. 4 is a representation of TFTs 412 and the light-emitting devices 72, viewed from the direction perpendicular to the substrate.

In FIG. 4, the source electrode 40 of each driving TFT 412 is electrically connected to a signal line 704, and the gate electrode 35 is electrically connected to a control circuit 50 (see FIG. 5A). Each second electrode 150 is integrated with a power supply line 706 and the adjacent second electrodes, which are corresponding to the respective TFTs 412, and supplies electrons to the luminescent layer 108 (see FIG. 3). The first electrode 106 is electrically connected to the drain electrode 45 to apply a voltage to the light-emitting device 72 so that the luminescent layer (not shown in FIG. 4) emits light. The TFTs 412 and the light-emitting devices 72 are aligned and serve as a line head 90 schematically shown in FIGS. 5A and 5B.

FIGS. 5A and 5B show the entirety of the line head 90: FIG. 5A is its bottom view and FIG. 5B is its side view. The line head 90 is intended as an exposure device of a below-described image-forming apparatus, and accordingly has the structure in which a plurality of the light-emitting devices 72 and the TFTs 412 for driving the light-emitting devices 72 are aligned on a long rectangular element substrate 60 with a control circuit 50 integrated for controlling the TFTs 412, as shown in FIG. 5A. As described above, the TFTs 412 and the light-emitting devices 72 aligned on the element substrate 60 are connected to the signal line 704 and the power supply line 706. A voltage is applied to the TFTs 412 from a power source (not shown) and the TFTs 412 are controlled by the control circuit 50, through these lines. Thus, the emission of the light-emitting devices 72 is controlled.

Turning to FIG. 5B, a sealing substrate 65 is bonded to the front surface of the element substrate 60 with a transparent adhesive to seal the light-emitting device 72 and other members, and a heatsink 80 is bonded to the rear surface. Thus, the line head 90 according to the present embodiment is of top emission type that emits light produced by the light-emitting devices through the sealing substrate 60. Accordingly, the sealing substrate 65 is made of a transparent material, such as glass. The heatsink 80 is made of, for example, a metal such as aluminum and suppresses the rise in temperature around the light-emitting devices 72, thus preventing the decreases in luminous efficiency and lifetime of the light-emitting devices.

Image-Forming Apparatus

Figure 6:
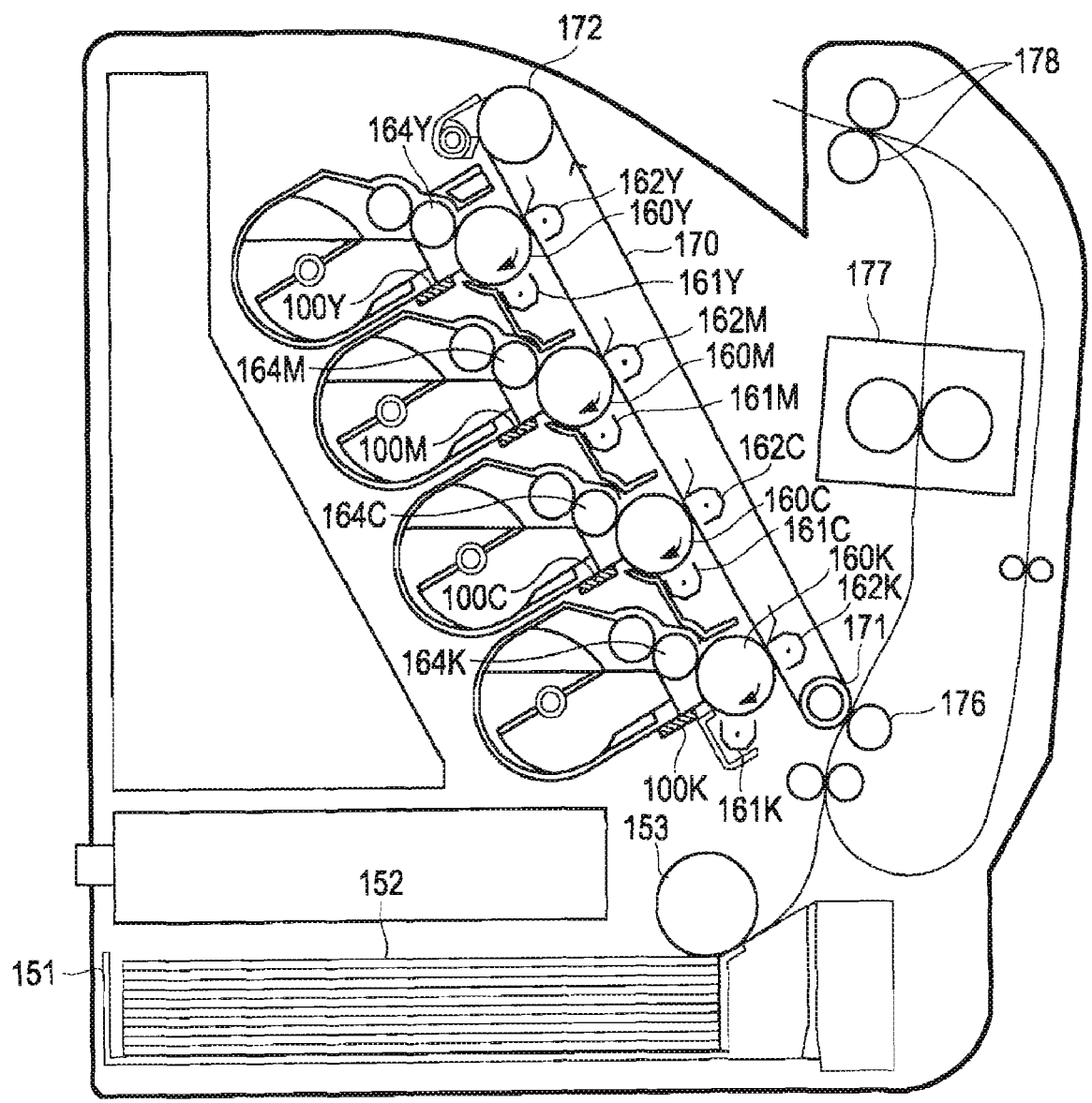
FIG. 6 is a schematic sectional view of a tandem color filter image-forming apparatus being an electronic apparatus according to an embodiment of the invention.

FIG. 6 is a schematic sectional view of a belt-intermediate transfer type tandem full-color image-forming apparatus being an electronic apparatus, having the line head 90 including the light-emitting devices according to the present embodiment of the invention aligned on a substrate.

The image-forming apparatus includes line head modules 100K, 100C, 100M, and 100Y disposed at the respective exposure positions of photosensitive drums 160K, 160C, 160M, and 160Y. Each line head module includes the line head 90 shown in FIG. 5 combined with an erect 1:1 imaging lens or the like (not shown). The letters K, C, M, and Y used with reference numerals are corresponding to black, cyan, magenta, and yellow respectively. The same applies to other members. As shown in FIG. 6, the image-forming apparatus also includes a driving roller 171 and a driven roller 172. An endless intermediate transfer belt 170 is wound around these rollers and turns around the driving roller 171 and the driven roller 172 as indicated by an arrow. In the vicinity of the intermediate transfer belt 170, four photosensitive drums 160K, 160C, 160M, and 160Y, each having a photosensitive layer on the periphery, are disposed at predetermined intervals. Each of the photosensitive drums 160K, 16C, 160M, and 160Y rotates in synchronization with the movement of the intermediate transfer belt 170.

Corona charging devices 161K, 161C, 161M, and 161Y and development devices 164K, 164C, 164M, and 164Y are disposed around the photosensitive drums 160K, 160C, 160M, and 160Y respectively. The corona charging devices 161K, 161C, 161M, and 164Y uniformly electrify the peripheries of their respective photosensitive drums 160K, 160C, 160M, and 160Y. The line head modules 100K, 100C, 100M, and 100Y continuously irradiate light produced by applying a voltage to the light-emitting devices 72 (see FIG. 5) to the charged peripheries of the rotating photosensitive drums 160K, 160C, 160M, and 160Y. Thus, electrostatic latent images are formed on the peripheries.

The monochromaticity of the light-emitting device 72 according to the present embodiment is enhanced by the resonance of the dielectric mirror, as described above. The distance from the light-emitting end surface of the image forming element, SELFOC® lens array, of each line head module 100 to the periphery of the corresponding photosensitive drum 160 is optimized according to the dominant wavelength of emitted light, and the emitted light shows an emission spectrum having an extremely narrow half-width. Consequently, images are sharply formed on the photosensitive layers, and thus sharp letters and images can be printed. The images are finally formed on a recording medium in the following process.

The developing devices 164K, 164C, 164M, and 164Y allow toner acting as a developer to adhere to the electrostatic latent images, thereby forming visible images on the photosensitive drums 160K, 160C, 160M, and 160Y. The black, cyan, magenta, and yellow visible images formed by these four-color monochromatic visible image-forming stations are primarily transferred one after another onto the intermediate transfer belt 170 so as to be superposed on the intermediate transfer belt 170, and thus full-color visible imaged are produced. Primary transfer corotrons (transfer devices) 162K, 162C, 162M, and 162Y are disposed inside the intermediate transfer belt 170. The primary transfer corotrons 162K, 162C, 162M, and 162Y are located in the vicinities of the respective photosensitive drums 160K, 160C, 160M, and 160Y, and electrostatically draw the visible images from the photosensitive drums 160K, 160C, 160M, and 160Y. Thus, the visible images are transferred to the intermediate transfer belt 170 running between the photosensitive drums 160K, 160C, 160M, and 160Y and the primary transfer corotrons 162K, 162C, 162M, and 162Y.

Finally, sheets of recording paper 152, or a recording medium, onto which the images are formed are transported one after another by a pickup roller 153 from a paper feed cassette 151 to the nip between the intermediate transfer belt 170 adjoining the driving roller 171 and a secondary transfer roller 176. The full-color visible images on the intermediate transfer belt 170 are secondarily transferred onto a side of the recording paper 152 at one time by the secondary transfer roller 176, and are fixed on the recording paper 152 by passing the paper between a pair of fixing rollers 177 acting as a fixing portion. Then, the recording paper 152 is discharged to a catch tray disposed on the image-forming apparatus by a pair of paper-discharging rollers 178 (not shown).

By using the line head modules 100 each including the light-emitting devices 72 whose monochromaticity is enhanced by the dielectric mirror for writing electrostatic latent images, an image-forming apparatus can be provided which can exhibit extremely high resolution although it has the same structure as known image-forming apparatuses.

The image-forming apparatus using the line heads 90 including the light-emitting devices according to the present embodiment is not limited to the tandem full-color image-forming apparatus, and may be a rotary development full-color image-forming apparatus of a belt-intermediate transfer type, or a monochrome image-forming apparatus.

Second Embodiment

FIGS. 7 to 12 show a light-emitting device according to a second embodiment of the invention, an organic LE display device (hereinafter referred to as the display device) being an electronic apparatus including the light-emitting device, and a mobile personal computer including the display device.

Figure 7:
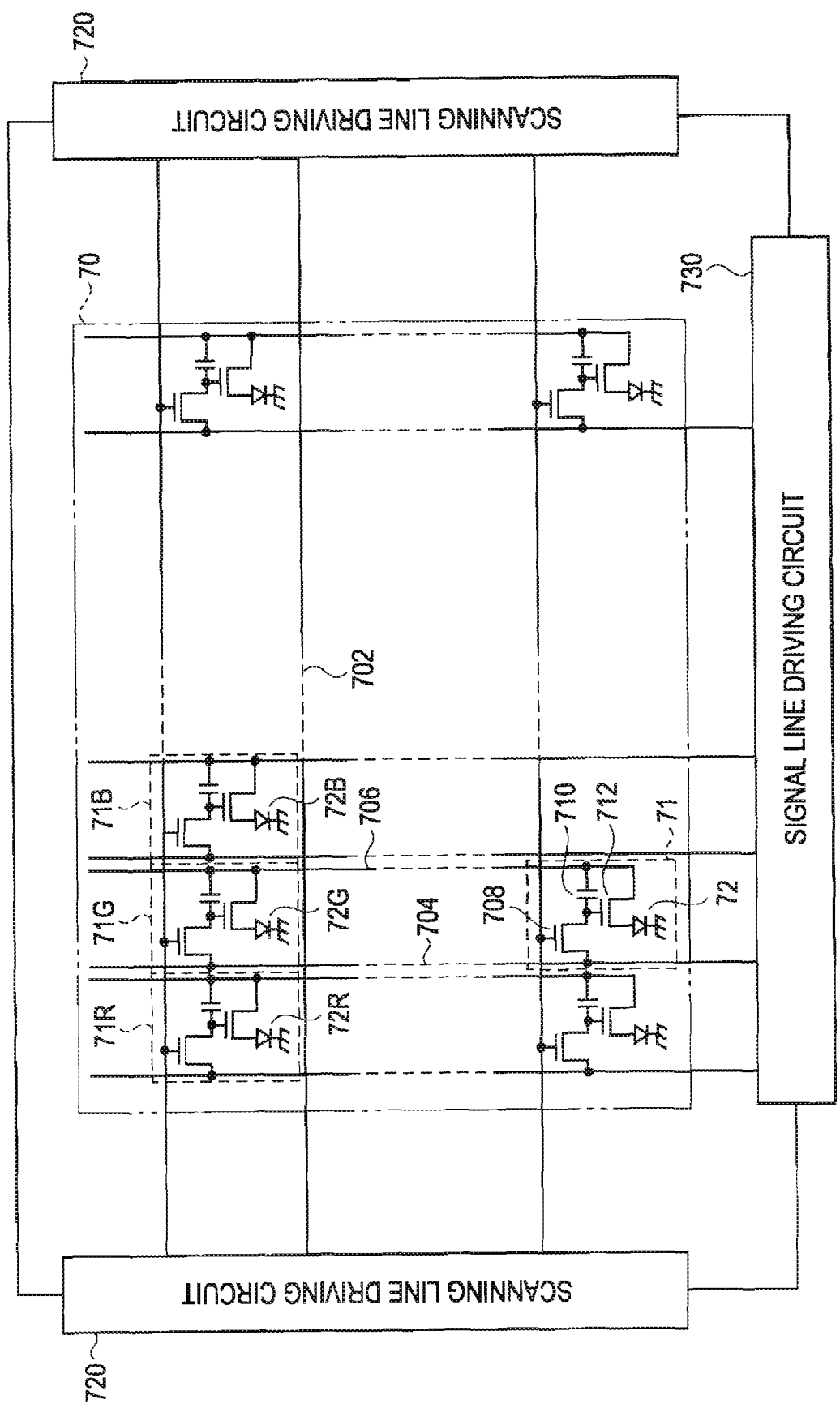
FIG. 7 is a circuit diagram of an entire display device.

FIG. 7 is an entire circuit diagram of a display device according to the present embodiment. The display device is of active matrix type that includes three types of light-emitting devices arranged in a matrix manner, each independently controlled to emit red, green, or blue light. The display device is broadly divided into an image display region and a peripheral region. The image display region 70 has a plurality of scanning lines 702, a plurality of signal lines 704 orthogonal to the scanning lines 702, and a plurality of power supply lines 706 extending parallel to the signal lines 704. Scanning line driving circuits 720 and a signal line driving circuit 730 are disposed around the image display region 70. The scanning line driving circuits 720 supply scanning signals to the scanning lines 702 according to the signals transmitted from an external circuit (not shown). The signal lien driving circuit 730 supplies image signals to the signal lines 704. A pixel driving current is applied to the power supply lines 706 from an external circuit (not shown). Light-emitting pixels 71 are formed corresponding to the intersections of the scanning lines 702 and the signal lines 704.

Each light-emitting pixel 71 includes a switching TFT 708 having a gate electrode to which a scanning signal is supplied through the scanning line 702; a hold capacitor 710 holding a pixel signal supplied from the signal line 704 through the switching TFT 708; a driving TFT 712 having a gate electrode to which the pixel signal held in the hold capacitor 710 is supplied; and a light-emitting device 72 to which the driving current flows from the power supply line 706 through the driving TFT 712. The light-emitting devices 72 include three types: red light-emitting devices 72R emitting red light; green light-emitting devices 72G emitting green light; and blue light-emitting devices 72B emitting blue light. The light-emitting devices 72 and other members described above define three types of light-emitting pixels: red light-emitting pixels 71R emitting red light; green light-emitting pixels 71G emitting green light; and blue light-emitting pixels 71B emitting blue light, corresponding to the colors of the respective light-emitting devices. Since the light-emitting devices emit light independently of each other, the display device of the present embodiment displays color images in the range defined by three points obtained by plotting three colors (three primary colors) emitted from the light-emitting pixels on a chromaticity diagram. Therefore, if the monochromaticity of each light-emitting device is increased, the range of display colors is increased and the display performance is enhanced. In the following description, letters R, G, and B used with reference numeral represent that the members designated by the reference numeral having the same functions are corresponding to red light, green light, and blue light respectively.

Figure 8:
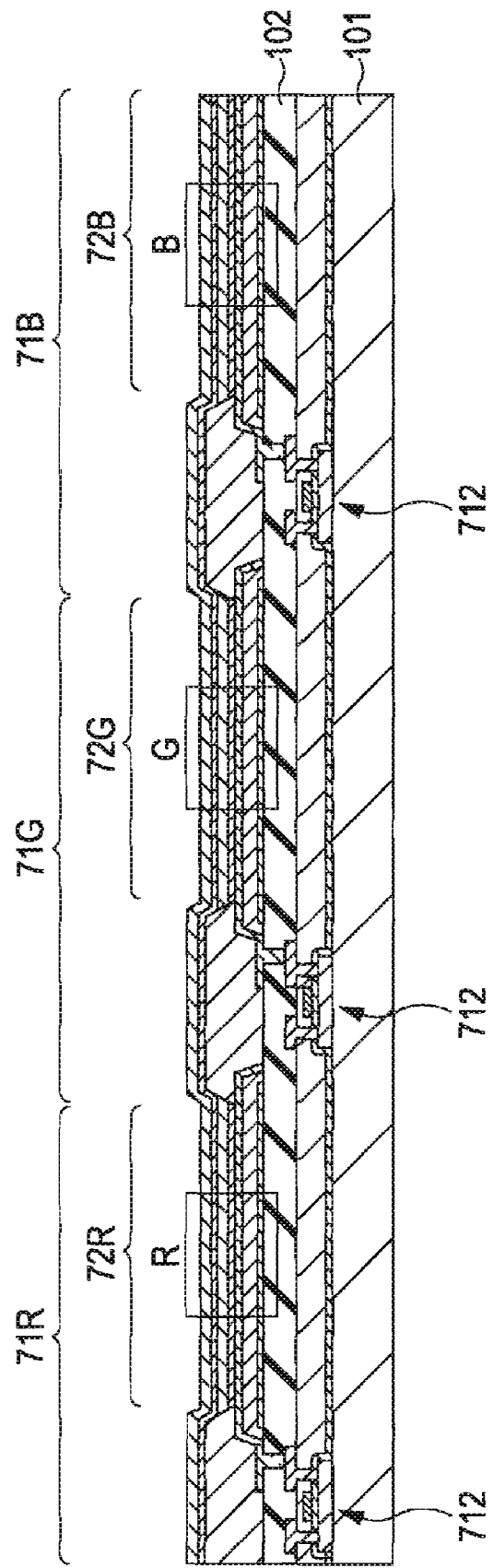
FIG. 8 is a sectional view of light-emitting devices for three primary colors and TFTs for driving the light-emitting devices.

FIG. 8 is a sectional view of the red light-emitting device 72R, the green light-emitting device 72G, and the blue light-emitting device 72B, and the driving TFTs 712 driving the respective light-emitting devices. The light-emitting devices respectively have dielectric mirrors 140R, 140G, and 140B (see FIG. 4). Each member has the same function as in the light-emitting device 72 and TFT 412 shown in FIG. 3, but the layers are made of different materials to different thicknesses. Accordingly, the materials and thicknesses will be described without description of the functions.

Figure 9A:
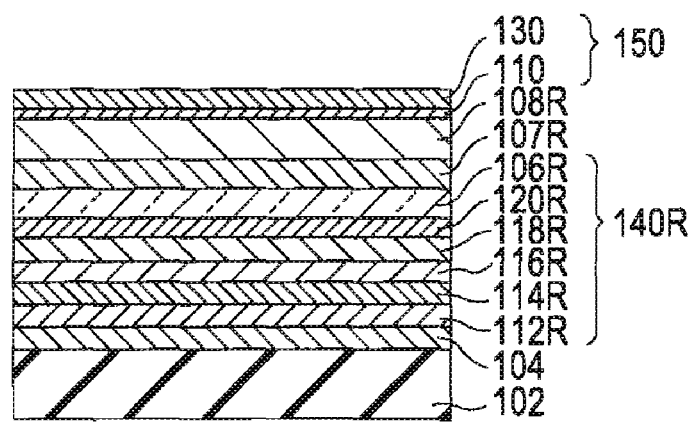
FIGS. 9A to 9C are enlarged sectional views of dielectric mirrors.
Figure 9B:
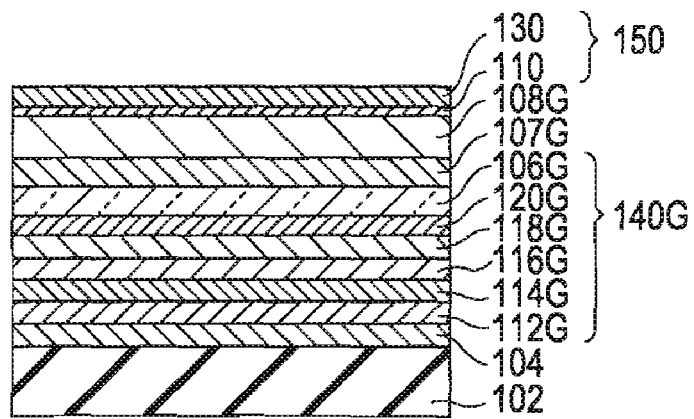
Figure 9C:
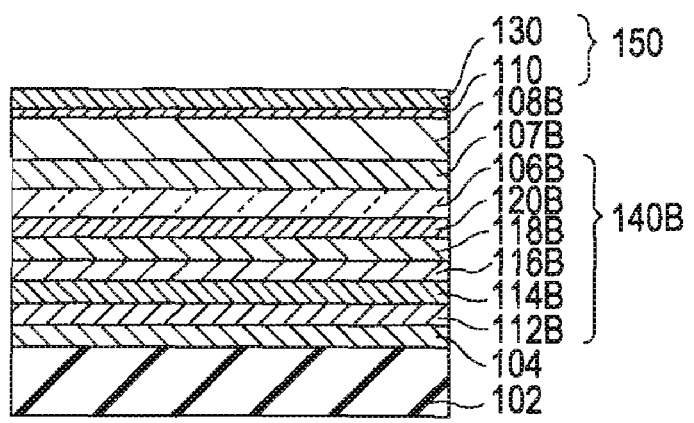

FIGS. 9A to 9C are enlarged sectional views of the dielectric mirrors shown in the frames designated by R, G, and B in FIG. 8. FIG. 9A shows the dielectric mirror 140R, designated by R, of the red light-emitting device 72R. Since this dielectric mirror 140R has the same structure as the dielectric mirror shown in FIG. 3B of the light-emitting device used in the image-forming apparatus, the description is omitted.

FIG. 9B shows the dielectric mirror 140G, designated by G in FIG. 8, of the green light-emitting device 72G. The second electrode 150 is formed by depositing an ITO layer 130 on an 18 nm thick semi-transparent semi-reflective Ca layer 110. Function layers including a green luminescent layer 108G and a hole injection layer 107G are disposed between the second electrode 150 and the first electrode 106G. The dielectric mirror 140G including the first electrode 106G is disposed on the light reflection layer 104 and strengthens light having a wavelength of about 540 nm. The green luminescent layer 108G is made of an above-listed luminescent layer material, such as a (poly)fluorene derivative (PF) or a (poly) para-phenylene vinylene derivative (PPV), to which quinacridone, coumarin 6, or the like is added, and emits green light having a wavelength of about 540 nm by energization. The thickness of the green luminescent layer 108G is set at 80 nm so that interference can occur in the function layers.

The dielectric mirror 140G is of three-pair type as with the dielectric mirror 140R of the red light-emitting device 72R and includes silicon oxide low-refractive-index material layers, silicon nitride high-refractive-index material layers, and an ITO high-refractive-index material layer doubling as the first electrode 106. The thicknesses of the layers of the dielectric mirror are set so that the dielectric mirror can function as an optical resonator for strengthening light having a wavelength of about 540 nm. More specifically, the dielectric mirror 140G includes a first low-refractive-index material layer 112G formed of silicon oxide to a thickness of 30 nm; a first high-refractive-index material layer 114G formed of silicon nitride to a thickness of 60 nm; a second low-refractive-index material layer 116G formed of silicon oxide layer to a thickness of 30 nm; a second high-refractive-index material layer 118G formed of silicon nitride to a thickness of 60 nm; a third low-refractive-index material layer 120G formed of silicon oxide to a thickness of 30 nm; and a third high-refractive-index material layer doubling as the first electrode 106G formed of ITO to a thickness of 60 nm.

As described above, about 50% of the light emitted upward from the luminescent layer 108 is reflected toward the substrate 101 from the semi-transparent semi-reflective Ca layer 110, and 50% of the entire light produced by the luminescent layer 108 travels toward the substrate 101. Hence, about 75% of the entire light produced by the green luminescent layer 108G enters the dielectric mirror 140G because of the effect of the semi-transparent semi-reflective Ca layer 110, and green light having a wavelength of about 540 nm is strengthened by the interference shown in FIG. 1B. In addition, the light having the same wavelength is strengthened in the function layers by the interference shown in FIG. 1C. Consequently, the light-emitting device emits green light with high monochromaticity.

FIG. 9C shows the dielectric mirror 140B, designated by B in FIG. 8, of the blue light-emitting device 72B. The second electrode 150 is formed by depositing an ITO layer 130 on an 18 nm thick semi-transparent semi-reflective Ca layer 110. Function layers including a blue luminescent layer 108B and a hole injection layer 107B are disposed between the second electrode 150 and the first electrode 106B. The dielectric mirror 140B including the first electrode 106B is disposed on the light reflection layer 104 and strengthens light having a wavelength of about 470 nm. The blue luminescent layer 108B is made of an above-listed luminescent layer material, such as a (poly)fluorene derivative (PF) or (poly)para-phenylene vinylene derivative (PPV), to which perylene, tetraphenylbutadiene, or the like is added, and emits blue light having a wavelength of about 470 nm by energization. The thickness of the blue luminescent layer is set at 80 nm so that interference can occur in the function layers.

The dielectric mirror 140B is of three-pair type as with the dielectric mirror 140R of the red light-emitting device 72R and includes silicon oxide low-refractive-index material layers, silicon nitride high-refractive-index material layers, and an ITO high-refractive-index material layer doubling as the first electrode 106. The thicknesses of the layers of the dielectric mirror is set so that the dielectric mirror can function as an optical resonator for strengthen light having a wavelength of about 470 nm. More specifically, the dielectric mirror 140B includes a first low-refractive-index material layer 112B formed of silicon oxide to a thickness of 8 nm, a first high-refractive-index material layer 114B formed of silicon nitride to a thickness of 70 nm, a second low-refractive-index material layer 116B formed of silicon oxide to a thickness of 8 nm, a second high-refractive-index material layer 118B formed of silicon nitride to a thickness of 70 nm, a third low-refractive-index material layer 120B formed of silicon oxide to a thickness of 8 nm, and a third high-refractive-index material layer doubling as the first electrode 106B formed of ITO to a thickness of 70 nm.

As described above, about 75% of the entire light produced by the blue luminescent layer 108B enters the dielectric mirror 140 because of the effect of the semi-transparent semi-reflective layer Ca layer 110. Thus, blue light having a wavelength of about 470 nm is strengthened by the interference shown in FIG. 1B. In addition, the light having the same wavelength is strengthened in the function layers by the interference shown in FIG. 1C. Consequently, the light-emitting device emits blue light with high monochromaticity.

Figure 10A:
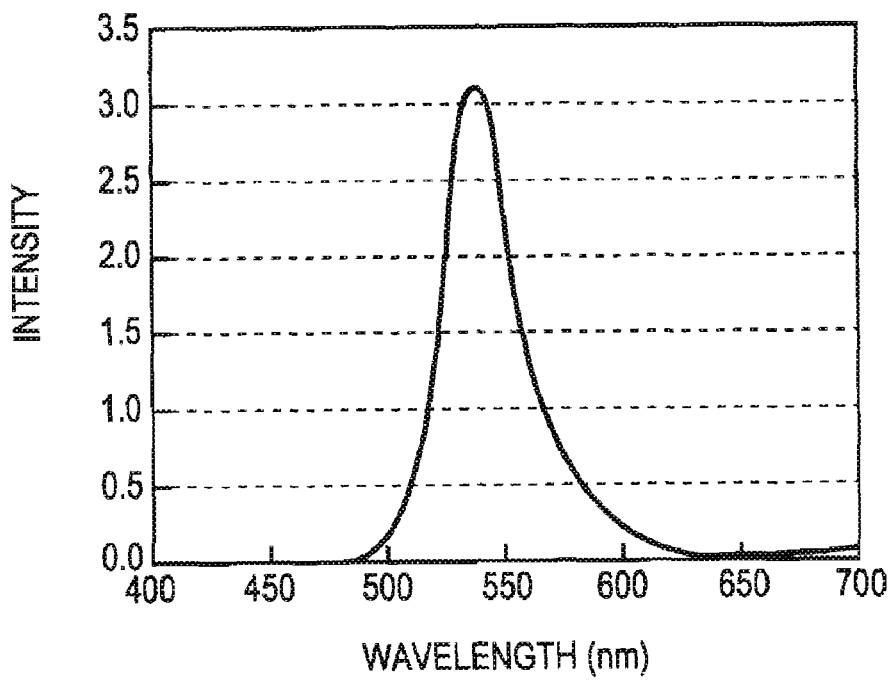
FIGS. 10A and 10B are graphs showing the effect of increasing the monochromaticity of green light.
Figure 10B:
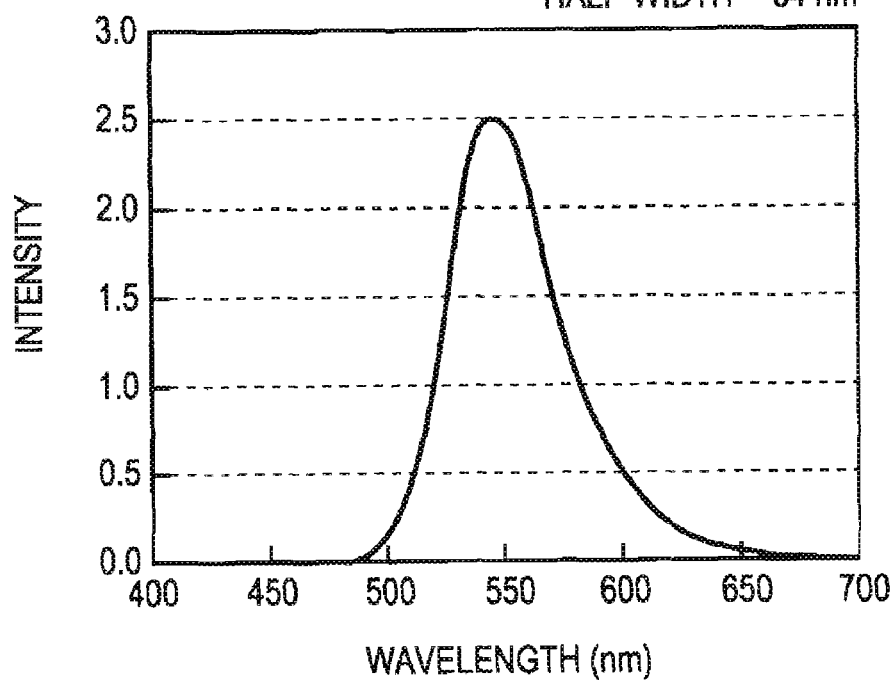
Figure 11A:
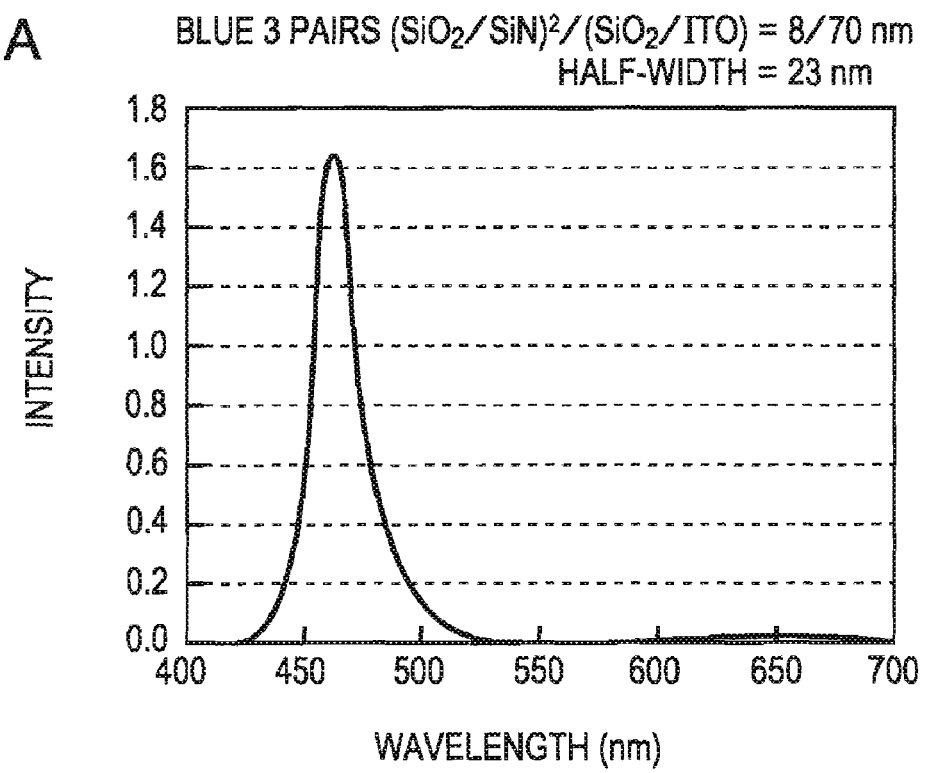
FIGS. 11A and 11B are representations showing the effect of increasing the monochromaticity of blue light.
Figure 11B:
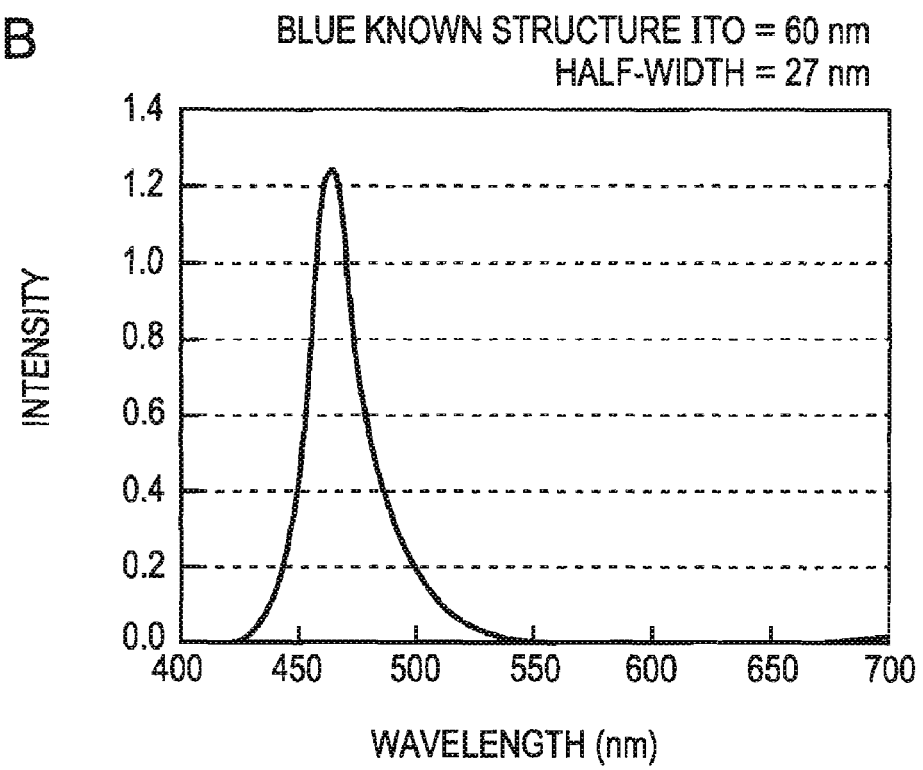

FIGS. 10A to 11B show the effects of the dielectric mirror to enhance the monochromaticity, that is, the effect in using the dielectric mirror 140 formed between the first electrode and the light reflection layer as a resonator. FIGS. 10A and 10B show the effect of enhancing the monochromaticity of green light, and FIGS. 11A and 11B show the effect of enhancing the monochromaticity of blue light (see FIGS. 2A to 2D for red light). Both the green and the blue light-emitting device according to the present embodiment exhibit higher intensities and narrower half-widths than the known structure having no dielectric mirror, that is, than light-emitting devices whose first electrode is directly formed on the light reflection layer; hence, the monochromaticity is enhanced. By arranging such R, G, and B three primary color light-emitting devices emitting light with enhanced monochromaticity in a matrix manner, the resulting display device can display color images in a wider range than known display devices.

Figure 12:
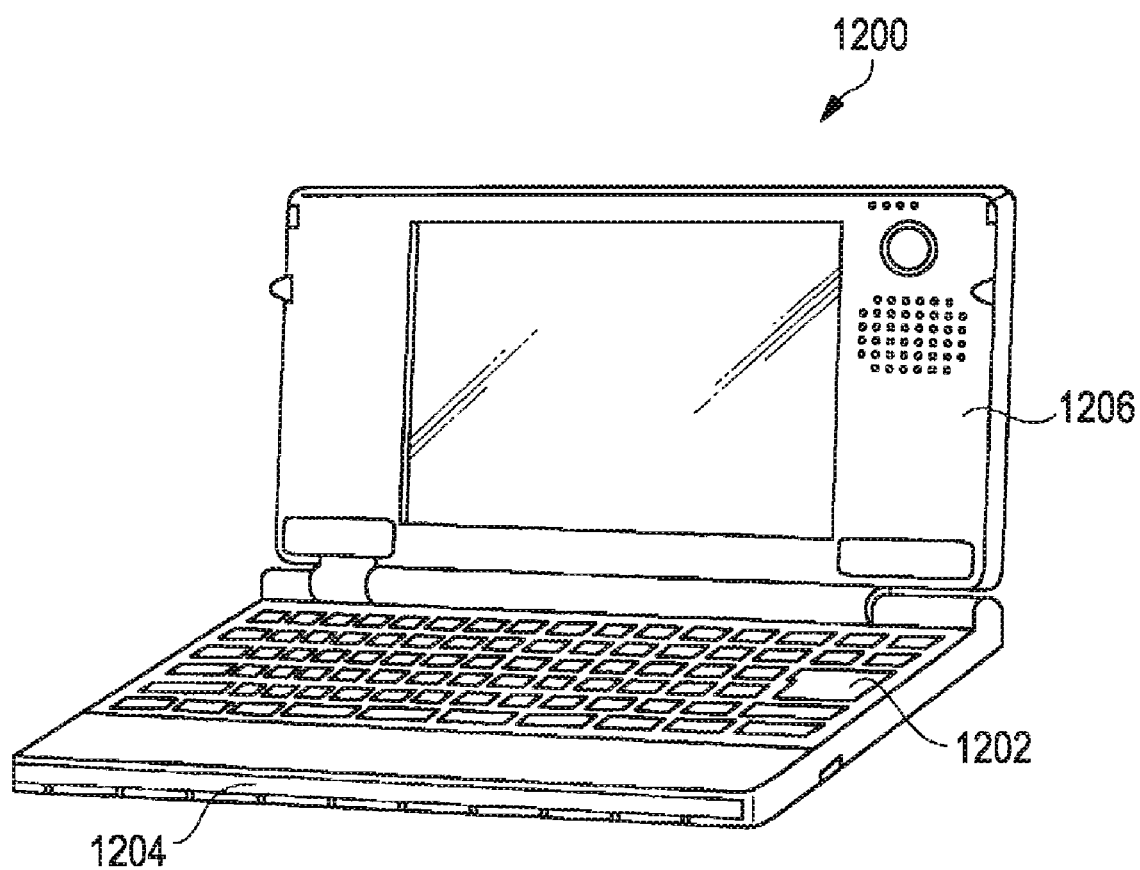
FIG. 12 is a perspective view of a personal computer being an electronic apparatus according to an embodiment of the invention.

A mobile personal computer using a color display device will now be described. The color display device includes light-emitting devices emitting red, green, and blue three primary color lights. FIG. 12 is a perspective view of the personal computer 1200. The personal computer 1200 has a body 1204 including a keyboard 1202, and a color display device 1206 including three primary color light-emitting devices emitting light whose monochromaticity is enhanced by the dielectric mirror. Since the light-emitting devices of the color display device 1206 emit light whose monochromaticity is enhanced, the personal computer 1200 exhibits enhanced display performance.

Modification

While a three-pair type dielectric mirror is used in the above-described embodiments, the number of pairs of layers of the dielectric mirror in the light-emitting device is not limited to three and may be four or more. Although a higher number of pair reduces the intensity the half-width is advantageously reduced. It is therefore preferable that the number of pairs be selected according to the application of the light-emitting device.

The entire disclosure of Japanese Application No. 2006-147735, filed May 29, 2006 is expressly incorporated by reference herein.

What is claimed is:

1. A top emission organic EL light-emitting device formed on a substrate, emitting light from the side opposite the substrate, the organic EL light-emitting device comprising:
    a light reflection layer over the substrate;
    a first electrode made of a transparent conductive material over the light reflection layer;
    a function layer disposed on the first electrode and including an organic EL luminescent layer that emits light;
    a second electrode disposed on the function layer and including a semi-transparent semi-reflective layer that transmits part of the light emitted from the organic EL luminescent layer and reflects the rest of the light; and
    a dielectric mirror disposed between the function layer and the light reflection layer, the dielectric mirror acting as an optical resonator that strengthens light having a specific wavelength,
    wherein the dielectric mirror is formed by alternately forming at least one low-refractive-index material layer and at least one high-refractive-index material layer on the light reflection layer, and
    wherein the first electrode constitutes one of the at least one high refractive index material layer.

2. The organic EL light-emitting device according to claim 1, wherein the first electrode is made of indium tin oxide and doubles as one of the at least one high-refractive-index material layer.

3. The organic EL light-emitting device according to claim 1, wherein the high-refractive-index material layer is made of silicon nitride.

4. The organic EL light-emitting device according to claim 1, wherein the low-refractive-index material layer is made of silicon oxide.

5. The organic EL light-emitting device according to claim 1, wherein the low-refractive-index material layer and the high-refractive-index material layer each have an optical path length equal to about a quarter of the specific wave length in the thickness direction.

6. The organic EL light-emitting device according to claim 1, wherein the sum of the optical path lengths of the low-refractive-index material layer and the high-refractive-index material layer in the thickness direction is about half of the specific wavelength.

7. The organic EL light-emitting device according to claim 1, the second electrode further includes a layer formed of a transparent conductive material on the semi-transparent semi-reflective layer.

8. The organic EL light-emitting device according to claim 1, wherein the first electrode and the semi-transparent semi-reflective layer are set so as to have an optical path length therebetween that can strengthen the light having the specific wavelength.

9. The organic EL light-emitting device according to claim 1, wherein the function layer further includes a hole injection layer on which the organic EL luminescent layer is disposed, and the sum of twice of the optical path length of the hole injection layer in the thickness direction and the optical path length of the organic EL luminescent layer in the thickness direction is about half of the specific wavelength.

10. An electronic apparatus comprising a line head module including a line head including the organic EL light-emitting devices as set forth in claim 1.

11. An electronic apparatus comprising:
an organic EL light-emitting device as set forth in claim 1 whose dielectric mirror acts as an optical resonator strengthening red light having a specific wavelength;
an organic EL light-emitting device as set forth in claim 1 whose dielectric mirror acts as an optical resonator strengthening green light having a specific wavelength; and
an organic EL light-emitting device as set forth in claim 1 whose dielectric mirror acts as an optical resonator strengthening blue light having a specific wavelength,
wherein the organic EL light-emitting devices of red, green, and blue lights are arranged in a matrix manner in a region from which light is emitted.

12. The organic EL light-emitting device according to claim 1, further comprising:
a second electrode disposed on the function layer, the second electrode including a semi-reflective layer that reflects approximately 50% of the light emitted from the organic EL luminescent layer and transmits the rest of the light.

* * * * *